United States Patent
Zou

(10) Patent No.: US 10,801,101 B2
(45) Date of Patent: Oct. 13, 2020

(54) VAPOR EVAPORATION SOURCE

(71) Applicant: WUHAN CHINA STAR OPTOELECTRONICS SEMICONDUCTOR DISPLAY TECHNOLOGY CO., LTD., Wuhan (CN)

(72) Inventor: Xin Zou, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 348 days.

(21) Appl. No.: 15/576,822

(22) PCT Filed: Oct. 19, 2017

(86) PCT No.: PCT/CN2017/106790
§ 371 (c)(1),
(2) Date: Nov. 26, 2017

(87) PCT Pub. No.: WO2019/033536
PCT Pub. Date: Feb. 21, 2019

(65) Prior Publication Data
US 2019/0055642 A1    Feb. 21, 2019

(30) Foreign Application Priority Data
Aug. 17, 2017 (CN) .......................... 2017 1 0706267

(51) Int. Cl.
*C23C 14/26* (2006.01)
*C23C 14/24* (2006.01)
*H01L 51/56* (2006.01)

(52) U.S. Cl.
CPC ............ *C23C 14/243* (2013.01); *C23C 14/26* (2013.01); *H01L 51/56* (2013.01)

(58) Field of Classification Search
CPC ........ C23C 14/243; C23C 14/26; H01L 51/56
See application file for complete search history.

(56) References Cited

U.S. PATENT DOCUMENTS

| | | | |
|---|---|---|---|
| 3,591,052 A * | 7/1971 | Nef ...................... | B22D 39/023 222/64 |
| 5,788,769 A | 8/1998 | Achtner et al. | |

(Continued)

FOREIGN PATENT DOCUMENTS

| | | |
|---|---|---|
| CN | 1162655 A | 10/1997 |
| CN | 101265567 A | 9/2008 |

(Continued)

OTHER PUBLICATIONS

Baptista, Andresa, et al., "Sputtering Physical Vapour Deposition (PVD) Coatings: A Critical Review on Process Improvement and Market Trend Demands". Coatings, 2018, 8, 402, pp. 1-22.*

(Continued)

*Primary Examiner* — Bret P Chen
(74) *Attorney, Agent, or Firm* — JMB Davis Ben-David

(57) ABSTRACT

A vapor evaporation source is provided. The vapor evaporation source includes a vapor evaporation source body made of conductive material, and the vapor evaporation source body has: a main body configured with a material chamber therein; and a first electrode connection terminal and a second electrode connection terminal disposed on outer sides of the main body. The first electrode connection terminal and the second electrode connection terminal have opposite polarities. After electrification of the first electrode connection terminal and the second electrode connection (Continued)

terminal, the main body itself conducts electricity and generates heat to heat material inside the material chamber.

15 Claims, 1 Drawing Sheet

(56) References Cited

U.S. PATENT DOCUMENTS

| | | | | |
|---|---|---|---|---|
| 8,956,288 B2* | 2/2015 | Hafezi | ............... | A61B 5/073 600/300 |
| 2001/0022272 A1* | 9/2001 | Plester | ............... | C23C 14/564 204/192.38 |
| 2005/0034671 A1* | 2/2005 | Ohara | ............... | C23C 14/12 118/726 |
| 2006/0186804 A1* | 8/2006 | Sakakura | ............ | H01L 27/3244 313/506 |
| 2007/0085475 A1* | 4/2007 | Kuwabara | ............... | H01L 51/56 313/506 |
| 2008/0226271 A1 | 9/2008 | Aulbach et al. | | |
| 2012/0024232 A1* | 2/2012 | Lee | ............... | C23C 14/12 118/726 |
| 2015/0082942 A1* | 3/2015 | Kishida | ............ | C01B 33/037 75/10.67 |

FOREIGN PATENT DOCUMENTS

| | | |
|---|---|---|
| CN | 201751427 U | 2/2011 |
| CN | 106119782 A | 11/2016 |
| JP | S6237366 A | 2/1987 |
| WO | WO 2017/104885 A1 * 6/2017 | ............. H01L 51/56 |

OTHER PUBLICATIONS

Yu, Hak Ki, et al., "Growth mechanism of metal-oxide nanowires synthesized by electron beam evaporation: A self-catalytic vapor-liquid-solid process". Scientific Reports, 2014; 4: 6589, pp. 1-8.*

Zoestbergen, E., et al., "Breakdown voltage of zinc and magnesium vapours". J. Phys. D: Appl. Phys. 47 (2014) 245501, pp. 1-7.*

Anatoly Kuzmichev and Leonid Tsybulsky (2011). Evaporators with Induction Heating and Their Applications, Advances in Induction and Microwave Heating of Mineral and Organic Materials, Prof. StanisÅ‚aw Grundas (Ed.), Chapter 13, ISBN: 978-953-307-522-8, InTech, pp. 269-302.*

SOG—Si Purification Technology and Equipment; Dec. 19, 2018; http://www.yiyaows.cn/n/print.jsp; http://img.duxiu.com/n/print.jsp; 4 pages, English abstract provided.

* cited by examiner

VAPOR EVAPORATION SOURCE

CROSS-REFERENCE TO RELATED APPLICATIONS

This is the U.S. National Stage of International Patent Application No. PCT/CN2017/106790, filed Oct. 19, 2017, which in turn claims the benefit of Chinese Patent Application No. 201710706267.6, filed Aug. 17, 2017.

FIELD OF INVENTION

The present disclosure relates to a technical field of vacuum evaporation, and more particularly to a vapor evaporation source.

BACKGROUND OF INVENTION

During vacuum evaporation processes, vapor evaporation materials are vaporized (or sublimated) into vapor by vapor evaporation sources, and the vapor is condensed into film layers on surfaces of objects to be coated. Therefore, whether the vapor generated by the vapor evaporation sources is even is crucial to the quality of the film layers formed. Vapor evaporation sources are usually in forms of "linear sources." A linear source includes a chamber having a rectangular shape. A top portion of the chamber is evenly configured with a plurality of vent holes, and a bottom portion of the chamber is connected with a crucible. The crucible carries and vaporizes vapor evaporation material. After vapor generated enters the chamber, the vapor is discharged from nozzles.

The quality of film layers formed is directly related to temperature and rate of vapor evaporation. In order to obtain even film layers, vapor evaporation materials need to be evenly heated. Main reasons for vapor evaporation sources currently used by production lines to cause crucibles to have uneven temperature distribution include heating wire deformation, dislocation of crucibles, heat conduction environment changes caused by heat deformation resulted from heat reflection of crucible surroundings, and the like.

In summary, for existing vapor evaporation sources, crucibles are heated unevenly, which causes vapor evaporation materials in vapor evaporation chambers to be heated unevenly, the quality of film layers formed to be poor, and difficulties in producing high-quality organic light-emitting diode (OLED) display panels.

SUMMARY OF INVENTION

The present disclosure provides a vapor evaporation source that causes each region of a material chamber to be heated evenly, thereby forming a high-quality film layer by vapor evaporation. Therefore, the technical problem that, for existing vapor evaporation sources, crucibles are heated unevenly, which causes vapor evaporation materials in vapor evaporation chambers to be heated unevenly, the quality of film layers formed to be poor, and difficulties in producing high-quality organic light-emitting diode (OLED) display panels is solved.

In order to solve the aforementioned problem, the present disclosure provides the following solutions.

The present disclosure provides a vapor evaporation source including a vapor evaporation source body made of conductive material. The vapor evaporation source body includes:

a main body configured with a material chamber therein, wherein an opening of the material chamber is located at a surface of the main body;

a first electrode connection terminal and a second electrode connection terminal disposed on outer sides of the main body, wherein the first electrode connection terminal and the second electrode connection terminal have opposite polarities, and wherein after electrification of the first electrode connection terminal and the second electrode connection terminal, the main body itself conducts electricity and generates heat to heat material inside the material chamber; and a coating layer coated on an inner wall of the material chamber to prevent vapor evaporation material from chemically reacting with material of the main body.

In accordance with an embodiment of the present disclosure, the vapor evaporation source further includes a cover body covering the surface of the main body such that the material chamber is sealed, wherein a surface of the cover body is integrally formed with at least one nozzle; a third electrode connection terminal and a fourth electrode connection terminal disposed on any positions of outer sides of the cover body, wherein the third electrode connection terminal and the fourth electrode connection terminal have opposite polarities, and wherein after electrification of the third electrode connection terminal and the fourth electrode connection terminal, the cover body itself conducts electricity and generates heat to heat the nozzle.

In accordance with an embodiment of the present disclosure, the first electrode connection terminal is located at a first end portion of the main body, and the second electrode connection terminal is located at a second end portion of the main body, wherein the second end portion of the main body is opposite to the first end portion of the main body; and the third electrode connection terminal is located at a first end portion of the cover body, and the fourth electrode connection terminal is located at a second end portion of the cover body, wherein the second end portion of the cover body is opposite to the first end portion of the cover body.

In accordance with an embodiment of the present disclosure, the first electrode connection terminal and the third electrode connection terminal are both positive electrodes; and the second electrode connection terminal and the fourth electrode connection terminal are both negative electrodes; wherein the first electrode connection terminal and the third electrode connection terminal are located on a same side of the vapor evaporation source body; and wherein the second electrode connection terminal and the fourth electrode connection terminal are located on another same side of the vapor evaporation source body.

In accordance with an embodiment of the present disclosure, the main body has a shape close to a rectangular cuboid, the first end portion is located at a central position of an end surface of the main body, and the second end portion is located at a central position of another end surface of the main body; and the cover body has a shape close to a rectangular cuboid, the third end portion is located at a central position of an end surface of the cover body, and the fourth end portion is located at a central position of another end surface of the cover body.

In accordance with an embodiment of the present disclosure, the main body and the cover body are made of high melting point material, wherein the high melting point material is one selected from a group consisting of W, Ni, Cr, Cu, Fe, Al, Nb, Mo, Ti, and any combination thereof.

In accordance with an embodiment of the present disclosure, the coating layer is one selected from a group consisting of Cu, Ti, $Al_2O_3$, MgO, BN, $Si_3N_4$, PBN, graphite, quartz, ceramic, and any combination thereof.

In accordance with an embodiment of the present disclosure, a bottom of the main body has a protrusion that defines a sub-material chamber, wherein a fifth electrode connection terminal is disposed on one side of the sub-material chamber, and a sixth electrode connection terminal is disposed on another opposite side of the sub-material chamber, and the fifth electrode connection terminal and the sixth electrode connection terminal have opposite polarities.

In accordance with an embodiment of the present disclosure, the sub-material chamber is located at a central position of the bottom of the main body.

The present disclosure also provides another vapor evaporation source including a vapor evaporation source body made of conductive material. The vapor evaporation source body includes:

a main body configured with a material chamber therein, wherein an opening of the material chamber is located at a surface of the main body; and a first electrode connection terminal and a second electrode connection terminal disposed on outer sides of the main body, wherein the first electrode connection terminal and the second electrode connection terminal have opposite polarities, and wherein after electrification of the first electrode connection terminal and the second electrode connection terminal, the main body itself conducts electricity and generates heat to heat material inside the material chamber.

In accordance with an embodiment of the present disclosure, the vapor evaporation source further includes a cover body covering the surface of the main body such that the material chamber is sealed, wherein a surface of the cover body is integrally formed with at least one nozzle; a third electrode connection terminal and a fourth electrode connection terminal disposed on any positions of outer sides of the cover body, wherein the third electrode connection terminal and the fourth electrode connection terminal have opposite polarities, and wherein after electrification of the third electrode connection terminal and the fourth electrode connection terminal, the cover body itself conducts electricity and generates heat to heat the nozzle.

In accordance with an embodiment of the present disclosure, the first electrode connection terminal is located at a first end portion of the main body, and the second electrode connection terminal is located at a second end portion of the main body, wherein the second end portion of the main body is opposite to the first end portion of the main body; and the third electrode connection terminal is located at a first end portion of the cover body, and the fourth electrode connection terminal is located at a second end portion of the cover body, wherein the second end portion of the cover body is opposite to the first end portion of the cover body.

In accordance with an embodiment of the present disclosure, the first electrode connection terminal and the third electrode connection terminal are both positive electrodes; and the second electrode connection terminal and the fourth electrode connection terminal are both negative electrodes; wherein the first electrode connection terminal and the third electrode connection terminal are located on a same side of the vapor evaporation source body; and wherein the second electrode connection terminal and the fourth electrode connection terminal are located on another same side of the vapor evaporation source body.

In accordance with an embodiment of the present disclosure, the main body has a shape close to a rectangular cuboid, the first end portion is located at a central position of an end surface of the main body, and the second end portion is located at a central position of another end surface of the main body; and the cover body has a shape close to a rectangular cuboid, the third end portion is located at a central position of an end surface of the cover body, and the fourth end portion is located at a central position of another end surface of the cover body.

In accordance with an embodiment of the present disclosure, the main body and the cover body are made of high melting point material, wherein the high melting point material is one selected from a group consisting of W, Ni, Cr, Cu, Fe, Al, Nb, Mo, Ti, and any combination thereof.

In accordance with an embodiment of the present disclosure, a bottom of the main body has a protrusion that defines a sub-material chamber, wherein a fifth electrode connection terminal is disposed on one side of the sub-material chamber, and a sixth electrode connection terminal is disposed on another opposite side of the sub-material chamber, and the fifth electrode connection terminal and the sixth electrode connection terminal have opposite polarities.

In accordance with an embodiment of the present disclosure, the sub-material chamber is located at a central position of the bottom of the main body.

Advantages of the present disclosure are: compared to existing vapor evaporation sources, the vapor evaporation source provided by the present disclosure is itself made of the conductive material. By disposing the positive and negative electrodes on corresponding positions of the vapor evaporation source, self-heat of the vapor evaporation source may be realized, thereby achieving heating uniformity, and causing high-quality film layers to be formed. Therefore, the technical problem that, for existing vapor evaporation sources, crucibles are heated unevenly, which causes vapor evaporation materials in vapor evaporation chambers to be heated unevenly, the quality of film layers formed to be poor, and difficulties in producing high-quality OLED display panels is solved.

DESCRIPTION OF DRAWINGS

In order to describe a technical solution in embodiments or existing technology more clearly, drawings required to be used by the embodiments or the existing technology are briefly introduced below. Obviously, the drawings in the description below are only some embodiments of the present disclosure. With respect to persons of ordinary skill in the art, under a premise that inventive efforts are not made, other drawings may be obtained based on these drawings.

DETAILED DESCRIPTION OF PREFERRED EMBODIMENTS

Figure 1:
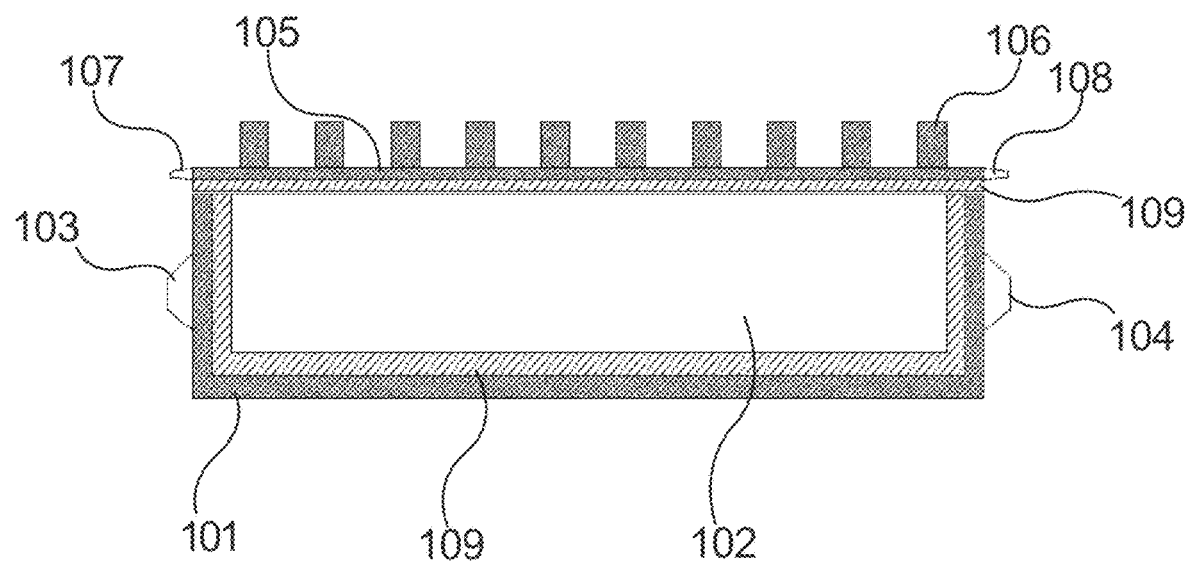
FIG. 1 is a schematic structural diagram of a vapor evaporation source provided by the present disclosure.

The description of each embodiment below refers to respective accompanying drawing(s), so as to illustrate exemplarily specific embodiments of the present disclosure that may be practiced. Directional terms mentioned in the present disclosure, such as "upper", "lower", "front", "back", "left", "right", "inner", "outer", "side", etc., are only directions by referring to the accompanying drawings, and thus the used directional terms are used to describe and understand the present disclosure, but the present disclosure is not limited thereto. In the drawings, structurally similar units are labeled by the same reference numerals.

The present disclosure is directed to solving the problem that, for existing vapor evaporation sources, crucibles are heated unevenly, which causes vapor evaporation materials in vapor evaporation chambers to be heated unevenly, the quality of film layers formed to be poor, and difficulties in producing high-quality organic light-emitting diode (OLED) display panels.

As illustrated in FIG. 1, a vapor evaporation source provided by the present disclosure includes a vapor evaporation source body. The vapor evaporation source body is itself made of conductive material. Because melting points of various materials heated by the vapor evaporation source are different, the conductive material of the vapor evaporation source body is high melting point metal material which is, for example, one selected from a group consisting of tungsten (W), nickel (Ni), chromium (Cr), copper (Cu), iron (Fe), aluminum (Al), niobium (Nb), molybdenum (Mo), titanium (Ti), and any combination thereof.

The vapor evaporation source body includes a main body 101, i.e., a crucible. The main body 101 is made by casting liquid metal material. A material chamber 102 is formed inside the main body 101. An opening of the material chamber 102 is located at a surface of the main body 101. The material chamber 102 carries vapor evaporation material. After the main body 101 heats the vapor evaporation material, the vapor evaporation material is vaporized, and condensed into a metal film layer on a surface of a target substrate.

A first electrode connection terminal 103 and a second electrode connection terminal 104 are disposed on outer sides of the main body 101. The first electrode connection terminal 103 is connected to a positive electrode port of a power supply. The second electrode connection terminal 104 is connected to a negative electrode port of the power supply. At this time, the main body 101 serves as a conductor, converting electrical energy into thermal energy. Regions of the main body 101 where current flows therethrough are all heating regions. Distribution of the current is determined by electrical conductivity of the conductive material. Therefore, by selecting material with better electrical conductivity for making the main body 101, the main body 101 having better heating uniformity is achieved.

For a related art that uses heating wires to heat the main body 101, distribution of the heating wires plays a decisive role in heating uniformity of the main body 101. Under an ordinary situation, the heating wires are distributed on the outside of the main body 101. By the heating wires, an external surface of the main body 101 is heated, and then using heat transfer of the main body 101 itself, heat is transferred to the material chamber 102 located inside the main body 101. From heating the surface of the main body 101 to heating the material chamber 102 inside the main body 101 by the heating wires, heat is partially consumed during a conduction process, causing temperature inside the material chamber 102 to be difficult to control.

The vapor evaporation source further includes a cover body 105 covering the surface of the main body 101. The cover body 105 is sealingly engaged with the material chamber 102 in the main body 101. A side of the cover body 105 away from the material chamber is configured with nozzles 106. The nozzles 106 are configured to uniformly spray the vapor evaporation material vaporized inside the material chamber 102 over the surface of the target substrate. The cover body 105 is similarly made of a high melting point conductive material. The nozzles 106 disposed on a surface of the cover body 105 are made of same material as and are integrally formed with the cover body 105.

Specifically, a third electrode connection terminal 107 and a fourth electrode connection terminal 108 are disposed on outer sides of the cover body 105. The third electrode is connected to the positive electrode port of the power supply. The second electrode connection terminal 104 is connected to the negative electrode port of the power supply. Similarly, the cover body 105 has current flowing therethrough and generates heat that results in secondary sublimation of evaporation material adhered to a bottom of the cover body 105, and the evaporation material being emitted through the nozzles 106, preventing material waste. Meanwhile, the nozzles 106 also generates heat. By heating the nozzles 106, the vapor evaporation material is prevented from being condensed inside the nozzles 106 and clogging the nozzles 106.

The first electrode connection terminal 103 is located at a first end portion of the main body 101, and the second electrode connection terminal 104 is located at a second end portion of the main body 101. The second end portion of the main body 101 is opposite to the first end portion of the main body. When the first electrode connection terminal 103 and the second electrode connection terminal 104 are being configured, the first electrode connection terminal 103 and the second electrode connection terminal 104 are disposed at two end locations of the main body 101, thereby lengthening a distance between the first electrode connection terminal 103 and the second electrode connection terminal 104. A distribution range of current on the main body 101 is wider, and therefore heat of the main body 101 is evenly distributed.

Similarly, the third electrode connection terminal 107 is located at a first end portion of the cover body 105, and the fourth electrode connection terminal 108 is located at a second end portion of the cover body 105. The second end portion of the cover body 105 is opposite to the first end portion of the cover body.

The first electrode connection terminal 103 and the third electrode connection terminal 107 are both positive electrodes. The second electrode connection terminal 104 and the fourth electrode connection terminal 108 are both negative electrodes. The first electrode connection terminal 103 and the third electrode connection terminal 107 are located on a same side of the vapor evaporation source body. The second electrode connection terminal 104 and the fourth electrode connection terminal 108 are located on another same side of the vapor evaporation source body. Compared to disposing electrode connection terminals of different components having different polarities on a same side of the vapor evaporation source body, disposing the electrode connection terminals of a same polarity on a same side better solves the aforementioned problem because of the following reason. Electrodes of different polarities attract each other, which causes a current flow direction to be changed. Current changes from flowing horizontally ideally into flowing vertically, causing heat to concentrate at an edge of the vapor evaporation source body, thereby failing to achieve heating uniformity.

The main body 101 has a shape close to a rectangular cuboid, the first end portion of the main body 101 is located at a central position of an end surface of the main body 101, and the second end portion of the main body 101 is located at a central position of another end surface of the main body 101. The cover body 105 has a shape close to a rectangular cuboid, the first end portion of the cover body 105 is located at a central position of an end surface of the cover body 105, and the second end portion of the cover body 105 is located at a central position of another end surface of the cover body 105. Similarly, by disposing electrode connection terminals at centers of the end surfaces of the main body 101, current is facilitated to be distributed evenly, thereby resulting in heat of each region of the main body 101 being distributed evenly.

In order to prevent the vapor evaporation material from chemically reacting with the materials that the main body 101 and the cover body 105 are made of, anti-reaction coating layers 109 are coated on an inner all of the material chamber 102 and the bottom of the cover body 105. Each coating layer 109 is one selected from a group consisting of copper (Cu), titanium (Ti), alumina ($Al_2O_3$), magnesium oxide (MgO), boron nitride (BN), silicon nitride ($Si_3N_4$), pyrolytic boron nitride (PBN), graphite, quartz, ceramic, and any combination thereof.

Figure 2:
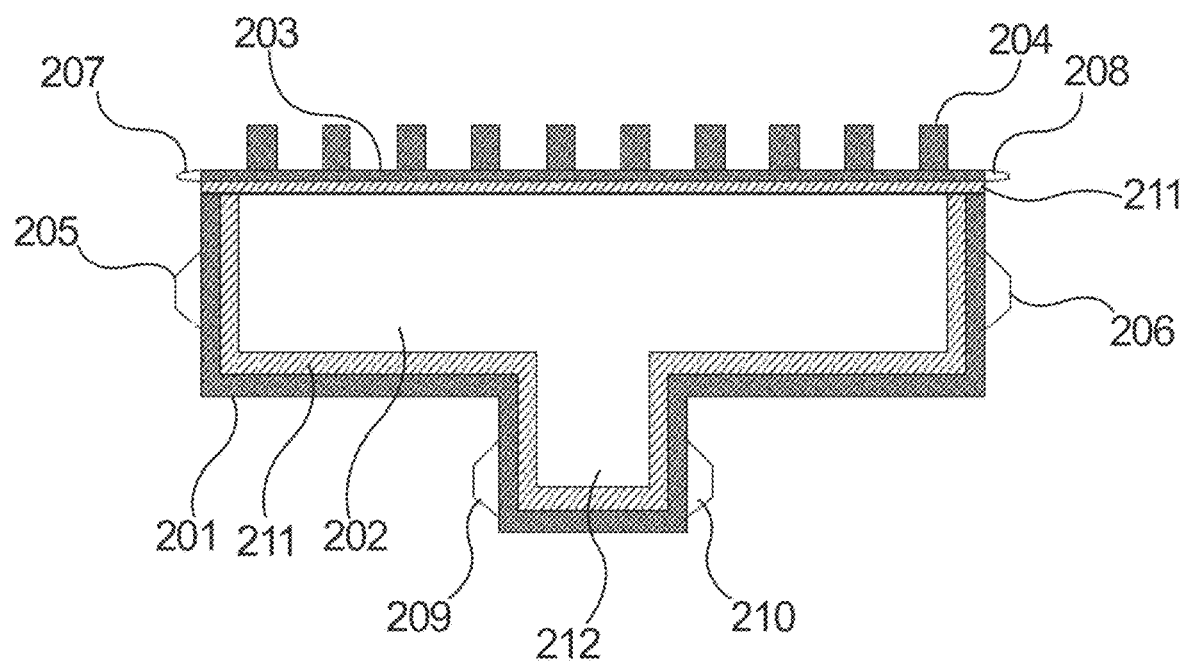
FIG. 2 is another schematic structural diagram of a vapor evaporation source provided by the present disclosure.

As illustrated in FIG. 2, the present disclosure also provides a vapor evaporation source including a vapor evaporation source body. The vapor evaporation source body includes a main body 201. A material chamber 202 is opened at a surface of the main body 201. A cover body 203 is disposed at the surface of the main body 201. The cover body 203 covers the surface of the main body 201. The cover body 203 is sealingly engaged with the material chamber 202 in the main body 101. A side of the cover body is configured with nozzles 204.

A first end portion of the main body 201 is configured with a first electrode connection terminal 205, and a second end portion at another opposite end of the main body 201 is configured with a second electrode connection terminal 206. A first end portion of the cover body is configured with a third electrode connection terminal 207, a second end portion at another opposite end of the cover body is configured with a fourth electrode connection terminal 208.

A bottom of the main body 201 has a protrusion that defines a sub-material chamber 212. A fifth electrode connection terminal 209 is disposed on one side of the sub-material chamber 212, and a sixth electrode connection terminal 210 is disposed on another opposite side of the sub-material chamber 212, and the fifth electrode connection terminal 209 and the sixth electrode connection terminal 210 have opposite polarities.

The material chamber 202, the sub-material chamber 212, and a bottom of the cover body 203 are coated with anti-chemical reaction layers 211.

A heating mechanism of the vapor evaporation source of the present disclosure is such that, with respect to different heating requirements, positive electrode connection terminals and negative electrode connection terminals are configured on corresponding components, thereby realizing heating uniformity of the vapor evaporation source body.

Advantages of the present disclosure are: compared to existing vapor evaporation sources, the vapor evaporation source provided by the present disclosure is itself made of the conductive material. By disposing the positive and negative electrodes on corresponding positions of the vapor evaporation source, self-heat of the vapor evaporation source may be realized, thereby achieving heating uniformity, and causing high-quality vapor-deposited film layers to be formed. Therefore, the technical problem that, for existing vapor evaporation sources, crucibles are heated unevenly, which causes vapor evaporation materials in vapor evaporation chambers to be heated unevenly, the quality of film layers formed to be poor, and difficulties in producing high-quality OLED display panels is solved.

In summary, although the present disclosure has been described with preferred embodiments thereof above, it is not intended to be limited by the foregoing preferred embodiments. Persons skilled in the art can carry out many changes and modifications to the described embodiments without departing from the scope and the spirit of the present disclosure. Therefore, the protection scope of the present disclosure is in accordance with the scope defined by the claims.

What is claimed is:

1. A vapor evaporation source, comprising a vapor evaporation source body made of conductive material, wherein the vapor evaporation source body comprises:
   a main body configured with a material chamber therein;
   a first electrode connection terminal and a second electrode connection terminal disposed on outer sides of the main body, wherein the first electrode connection terminal and the second electrode connection terminal have opposite polarities, and wherein after electrification of the first electrode connection terminal and the second electrode connection terminal, the main body itself conducts electricity and generates heat to heat material inside the material chamber;
   a coating layer coated on an inner wall of the material chamber to prevent vapor evaporation material from chemically reacting with material of the main body;
   a cover body covering a surface of the main body such that the material chamber is sealed, wherein a surface of the cover body is integrally formed with at least one nozzle; and
   a third electrode connection terminal and a fourth electrode connection terminal disposed on outer sides of the cover body, wherein the third electrode connection terminal and the fourth electrode connection terminal have opposite polarities, and wherein after electrification of the third electrode connection terminal and the fourth electrode connection terminal, the cover body itself conducts electricity and generates heat to heat the nozzle.

2. The vapor evaporation source of claim 1, wherein
   the first electrode connection terminal is located at a first end portion of the main body, and the second electrode connection terminal is located at a second end portion of the main body, wherein the second end portion of the main body is opposite to the first end portion of the main body; and
   the third electrode connection terminal is located at a first end portion of the cover body, and the fourth electrode connection terminal is located at a second end portion of the cover body, wherein the second end portion of the cover body is opposite to the first end portion of the cover body.

3. The vapor evaporation source of claim 2, wherein the first electrode connection terminal and the third electrode connection terminal are both positive electrodes; and the second electrode connection terminal and the fourth electrode connection terminal are both negative electrodes;
   wherein the first electrode connection terminal and the third electrode connection terminal are located on a same side of the vapor evaporation source body; and
   wherein the second electrode connection terminal and the fourth electrode connection terminal are located on another same side of the vapor evaporation source body.

4. The vapor evaporation source of claim 2, wherein
   the first end portion of the main body is located at a central position of an end surface of the main body, and the second end portion of the main body is located at a central position of another end surface of the main body; and the first end portion of the cover body is located at a central position of an end surface of the cover body, and the second end portion of the cover body is located at a central position of another end surface of the cover body.

5. The vapor evaporation source of claim 1, wherein the main body and the cover body are made of high melting point material, wherein the high melting point material is one selected from a group consisting of W, Ni, Cr, Cu, Fe, Al, Nb, Mo, Ti, and any combination thereof.

6. The vapor evaporation source of claim 1, wherein the coating layer is one selected from a group consisting of Cu, Ti, $Al_2O_3$, MgO, BN, $Si_3N_4$, PBN, graphite, quartz, ceramic, and any combination thereof.

7. The vapor evaporation source of claim 1, wherein a bottom of the main body has a protrusion that defines a sub-material chamber, wherein a fifth electrode connection terminal is disposed on one side of the sub-material chamber, and a sixth electrode connection terminal is disposed on another opposite side of the sub-material chamber, and the fifth electrode connection terminal and the sixth electrode connection terminal have opposite polarities.

8. The vapor evaporation source of claim 7, wherein the sub-material chamber is located at a central position of the bottom of the main body.

9. A vapor evaporation source, comprising a vapor evaporation source body made of conductive material, wherein the vapor evaporation source body comprises:
a main body configured with a material chamber therein;
a first electrode connection terminal and a second electrode connection terminal disposed on outer sides of the main body, wherein the first electrode connection terminal and the second electrode connection terminal have opposite polarities, and wherein after electrification of the first electrode connection terminal and the second electrode connection terminal, the main body itself conducts electricity and generates heat to heat material inside the material chamber;
a cover body covering a surface of the main body such that the material chamber is sealed, wherein a surface of the cover body is integrally formed with at least one nozzle; and
a third electrode connection terminal and a fourth electrode connection terminal disposed on outer sides of the cover body, wherein the third electrode connection terminal and the fourth electrode connection terminal have opposite polarities, and wherein after electrification of the third electrode connection terminal and the fourth electrode connection terminal, the cover body itself conducts electricity and generates heat to heat the nozzle.

10. The vapor evaporation source of claim 9, wherein
the first electrode connection terminal is located at a first end portion of the main body, and the second electrode connection terminal is located at a second end portion of the main body, wherein the second end portion of the main body is opposite to the first end portion of the main body; and
the third electrode connection terminal is located at a first end portion of the cover body, and the fourth electrode connection terminal is located at a second end portion of the cover body, wherein the second end portion of the cover body is opposite to the first end portion of the cover body.

11. The vapor evaporation source of claim 10, wherein the first electrode connection terminal and the third electrode connection terminal are both positive electrodes; and the second electrode connection terminal and the fourth electrode connection terminal are both negative electrodes;
wherein the first electrode connection terminal and the third electrode connection terminal are located on a same side of the vapor evaporation source body; and
wherein the second electrode connection terminal and the fourth electrode connection terminal are located on another same side of the vapor evaporation source body.

12. The vapor evaporation source of claim 10, wherein
the first end portion of the main body is located at a central position of an end surface of the main body, and the second end portion of the main body is located at a central position of another end surface of the main body; and
the first end portion of the cover body is located at a central position of an end surface of the cover body, and the second end portion of the cover body is located at a central position of another end surface of the cover body.

13. The vapor evaporation source of claim 9, wherein the main body and the cover body are made of high melting point material, wherein the high melting point material is one selected from a group consisting of W, Ni, Cr, Cu, Fe, Al, Nb, Mo, Ti, and any combination thereof.

14. The vapor evaporation source of claim 9, wherein a bottom of the main body has a protrusion that defines a sub-material chamber, wherein a fifth electrode connection terminal is disposed on one side of the sub-material chamber, and a sixth electrode connection terminal is disposed on another opposite side of the sub-material chamber, and the fifth electrode connection terminal and the sixth electrode connection terminal have opposite polarities.

15. The vapor evaporation source of claim 14, wherein the sub-material chamber is located at a central position of the bottom of the main body.

* * * * *